(12) United States Patent
Kong et al.

(10) Patent No.: US 7,839,716 B2
(45) Date of Patent: Nov. 23, 2010

(54) APPARATUS AND SYSTEMS FOR VT INVARIANT DDR3 SDRAM WRITE LEVELING

(75) Inventors: Cheng-Gang Kong, Saratoga, CA (US); Thomas Hughes, San Francisco, CA (US)

(73) Assignee: LSI Corporation, Milpitas, CA (US)

( * ) Notice: Subject to any disclaimer, the term of this patent is extended or adjusted under 35 U.S.C. 154(b) by 164 days.

(21) Appl. No.: 12/339,232

(22) Filed: Dec. 19, 2008

(65) Prior Publication Data
US 2010/0157700 A1 Jun. 24, 2010

(51) Int. Cl.
*G11C 8/16* (2006.01)

(52) U.S. Cl. .................. 365/233.13; 365/233.11; 365/194

(58) Field of Classification Search .......... 365/233.13, 365/194, 233.11
See application file for complete search history.

(56) References Cited

U.S. PATENT DOCUMENTS

| | | | |
|---|---|---|---|
| 7,231,536 B1 * | 6/2007 | Chong et al. | 713/400 |
| 7,477,074 B1 * | 1/2009 | Pan et al. | 326/41 |
| 7,725,755 B1 * | 5/2010 | Chong et al. | 713/500 |
| 2010/0054073 A1 * | 3/2010 | Park | 365/233.1 |

* cited by examiner

*Primary Examiner*—Hoai V Ho
*Assistant Examiner*—Fernando N Hidalgo
(74) *Attorney, Agent, or Firm*—Duft Bornsen & Fishman LLP

(57) ABSTRACT

Apparatus and systems for improved PVT invariant fast rank switching in a DDR3 memory subsystem. A clock skew control circuit is provided between a memory controller and a DDR3 SDRAM memory subsystem to adjust skew between the DDR3 clock signal and data related signals (e.g., DQ and/or DQS). A initial write-leveling procedure determines the correct skew and programs a register file in the skew adjustment circuit. The register file includes a register for each of multiple ranks in the DDR3 memory. The values in each register serve to control selection of alignment of the data related signals to align with one of multiple phase shifted versions of a 1× DDR3 clock signal. The phase shifted clock signals are generated by clock divider circuits from a 2× DDR clock signal and use of a single fixed delay line approximating ⅛ of a 1× DDR3 clock period.

14 Claims, 7 Drawing Sheets

APPARATUS AND SYSTEMS FOR VT INVARIANT DDR3 SDRAM WRITE LEVELING

BACKGROUND

1. Field of the Invention

The invention relates generally to memory controller logic and more specifically relates to improved structures and systems for voltage and temperature (VT) invariant, fast rank switching in control of DDR3 SDRAM devices.

2. Discussion of Related Art

In the control of synchronous dynamic random access memory (SDRAM) phase relationships between clock signals (CK) and strobe signals (DQS) indicating validity of an associated data signal (DQ) are important to proper operation of the SDRAM device. In particular, so-called "double data rate" (DDR) SDRAM devices require significant care in the design of memory controlling devices to assure proper alignment and timing of these various signals. In more recent DDR2 SDRAM devices, these signals are specified to much faster data rates and consequently timing tolerances became even more critical. In like manner, newer DDR3 data rate have again increased and thus the related timing tolerance are still tighter.

In the architecture of DDR3 memory control, a so-called "fly-by" architecture is proposed by the related specifications where the clock (CK) signal from a memory control device is serially daisy chained from SDRAM device to SDRAM device. So distributing the CK signal over the various SDRAM devices (i.e., over multiple ranks) results in an approximate 0 to 2 ns skew between the CK signal and the individual DQS (data strobe) signals applied to each rank. Such a skew can violate a requirement of DDR3 signal timing that requires a ¼ clock phase relationship between the CK signal and the DQS signal as applied to a particular rank.

With such a tight timing tolerance in view of the higher data rates of DDR3 standards, some technique must be employed to match individual DQS and DQ signals to corresponding CK signals. This problem is further exacerbated when multiple ranks of SDRAMs are provided. For example, in an application with two DDR3 SDRAM slots, each slot having 2 ranks, the cumulative delays of the fly-by clock over 4 such ranks of DDR3 SDRAM devices can violate the timing requirements of DDR3 standards.

Prior solutions to assure proper timing in DDR2 SDRAM application have relied on the fact that a DDR2 CK signal was matched to a corresponding DQS signal within the SDRAM package. If the skew of the CK and DQS signals was kept to a minimum within the memory control device and the associated PC board layout, then any difference of signal timing across the four ranks of SDRAM devices could be absorbed by the ¼ clock cycle tolerance allowed for CK and DQS skew. The higher data rates of DDR3 SDRAM standards and the fly-by architecture of the CK signal have rendered this older assumption invalid. An example of DDR3 fly-by CK architecture is shown in prior art FIG. 1. Two DIMMs (104 and 106) are configured in the exemplary prior art system 100 of FIG. 1. A CK signal 150 is generated by controller 102 and distributed in a fly-by layout (the thicker signal line). Associated DQ/DQS signals (120.0 through 120.8) are generated by controller 102 and distributed to associated SDRAM chips on each of four banks (110 through 113) of DIMM memory packages 104 and 106. With a DDR3 CK frequency of 800 MHz to 1.6 GHz, the ¼ cycle tolerance for CK to DQS skew is 312 ps, which is easily broken across a single group of four ranks (having a typical skew of 0.2 to 0.4 ns), let alone, the larger skew associated with the CK fly-by architecture (having a typical skew of 2 ns).

One prior solution to these timing skew problems of a DDR3 SDRAM fly-by clock architecture is to provide delay lines 160 within the controller 102 and to perform a so-called "write-leveling" procedure. The write-leveling procedure is a process to configure the use of the variable delay lines within the memory controller to adapt to the particular timing requirements of the SDRAM application. The write-leveling operation is performed at startup of the system using the DDR3 SDRAM subsystem. However, such delay lines may be subject to VT variation as the memory system is operable. Thus, for high reliability in high speed applications it may be necessary to periodically repeat the write-leveling operation. Since the write-leveling operation requires that the memory subsystem be "off-line" (e.g., unusable for its intended application function), such periodic repetition of write-leveling operations may degrade the performance of the system using the DDR3 SDRAM subsystem.

Thus it is an ongoing challenge to provide VT invariant DDR3 SDRAM applications that permit continuous high speed operation.

SUMMARY

The present invention solves the above and other problems, thereby advancing the state of the useful arts, by providing apparatus, systems, and methods for improved VT invariance in a DDR3 SDRAM subsystem without requiring periodic write-leveling operations. A circuit in accordance with features and aspects hereof generates a variety of phases of a clock from a base clock frequency that is twice that of the DDR3 CK signal. Applying the various phases adjusts the delay of the DQ or DQS signals relative to the underlying base CK signal and avoids the VT variance characteristic of prior delay line based solutions.

In one aspect hereof, a clock skew control circuit is provided for controlling timing skew between a clock signal (CK) and a first data related signal and between the CK signal and a second data related signal in a double data rate (DDR3) synchronous dynamic random access memory (SDRAM) memory subsystem. The clock skew control circuit including a clock generator coupled to receive a 2× clock signal having a frequency twice that of the CK signal of the DDR3 SDRAM. The clock generator adapted to generate the CK signal and adapted to generate a 45 degree phase shifted version of the CK signal (CK45) and a 90 degree phase shifted version of the CK signal (CK90) and a 135 degree phase shifted version of the CK signal (CK135). The clock skew control circuit further includes a delayed data signal generator coupled to receive the first and second data related signals and coupled to receive the CK signal and the CK45 signal and the CK90 signal and the CK135 signal. The delayed data signal generator is adapted to generate a first delayed data signal from the first data related signal selectively aligned with a leading edge of one of the CK signal and the CK45 signal and the CK90 signal and the CK 135 signal. The delayed data signal generator is also adapted to generate a second delayed data signal from the second data related signal selectively aligned with a trailing edge of one of the CK signal and the CK45 signal and the CK90 signal and the CK135 signal. The first and second delayed data signals are applied to a DDR3 SDRAM device.

Another aspect hereof provides a memory subsystem that includes a memory controller circuit adapted to generate a first data related signal and a second data related signal and adapted to generate a rank selection signal. The subsystem also includes a double data rate (DDR3) synchronous dynamic random access memory (SDRAM) circuit having multiple ranks. The DDR3 SDRAM circuit adapted to receive a 1× DDR clock signal and adapted to receive data related signals. The DDR3 SDRAM circuit having a specified timing skew relationship between the 1× DDR clock signal and the data related signals. The subsystem also includes a 2× clock signal source that generates a 2× clock signal having a frequency twice the frequency of a 1× DDR clock signal (CK signal) expected by the DDR3 SDRAM circuit. The subsystem further includes a clock skew control circuit coupled to receive the first data related signal and the second data related signal and the rank selection signal from the memory controller circuit and coupled to receive the 2× clock signal from the 2× clock signal source. The clock skew control circuit adapted to generate a first delayed data signal and a second delayed data signal and coupled to apply the first and second delayed data signals to the DDR3 SDRAM circuit. The clock skew control circuit further comprises a clock generator coupled to receive a 2× clock signal and adapted to generate CK signal and adapted to generate a 45 degree phase shifted version of the CK signal (CK45) and a 90 degree phase shifted version of the CK signal (CK90) and a 135 degree phase shifted version of the CK signal (CK135). The clock skew control circuit further includes a delayed data signal generator coupled to receive the first and second data related signals and coupled to receive the CK signal and the CK45 signal and the CK90 signal and the CK135 signal. The delayed data signal generator is adapted to generate the first delayed data signal from the first data related signal selectively aligned with a leading edge of one of the CK signal and the CK45 signal and the CK90 signal and the CK135 signal. The delayed data signal generator is also adapted to generate the second delayed data signal from the second data related signal selectively aligned with a trailing edge of one of the CK signal and the CK45 signal and the CK90 signal and the CK135 signal. The first and second delayed data signals are applied to a DDR3 SDRAM device.

DETAILED DESCRIPTION OF THE DRAWINGS

Figure 1:
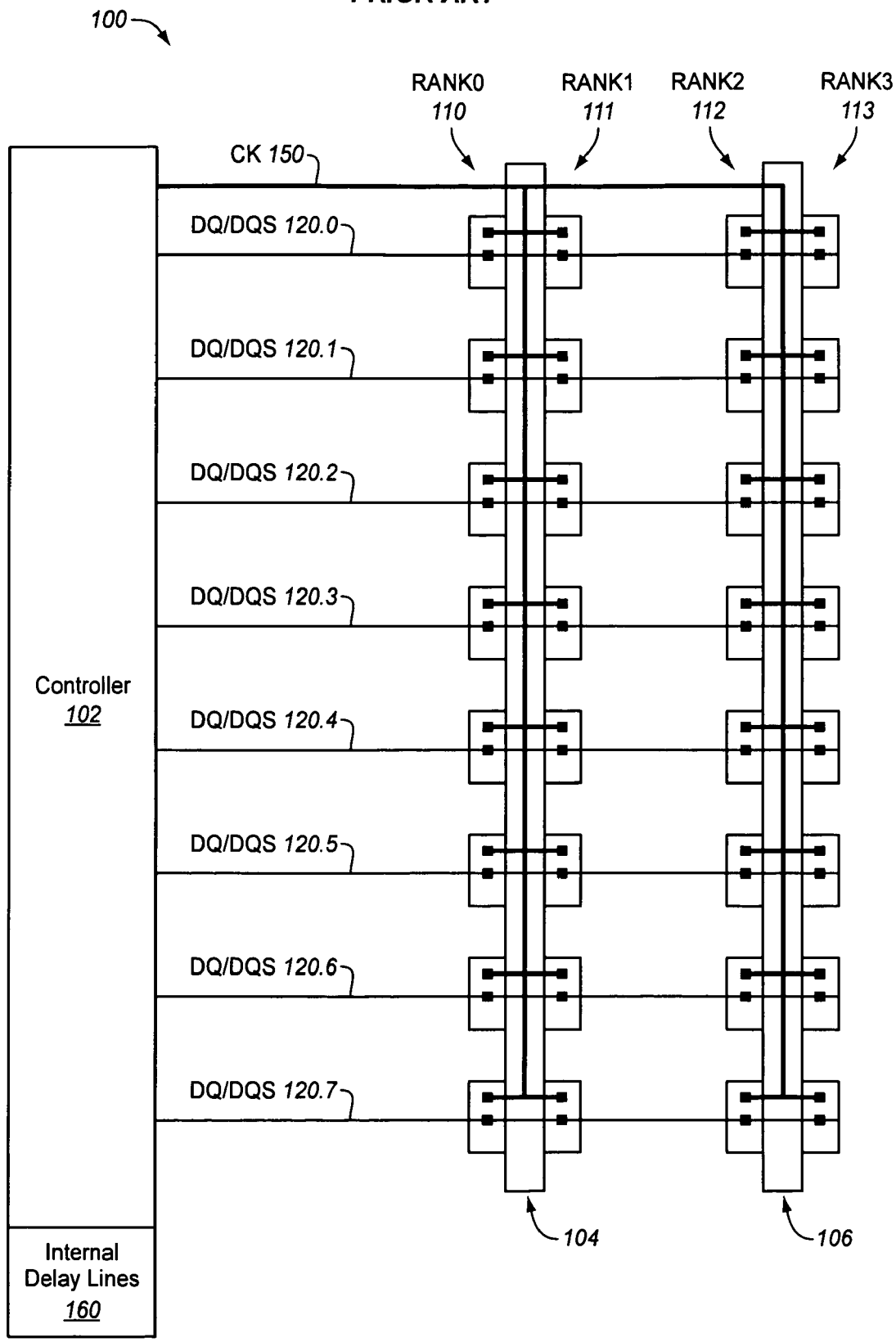
FIG. 1 is a block diagram of a memory subsystem as presently known in the art where a memory controller programs internal variable delay lines to adjust for skew between a clock signal and data related signals applied to a memory device.
Figure 2:
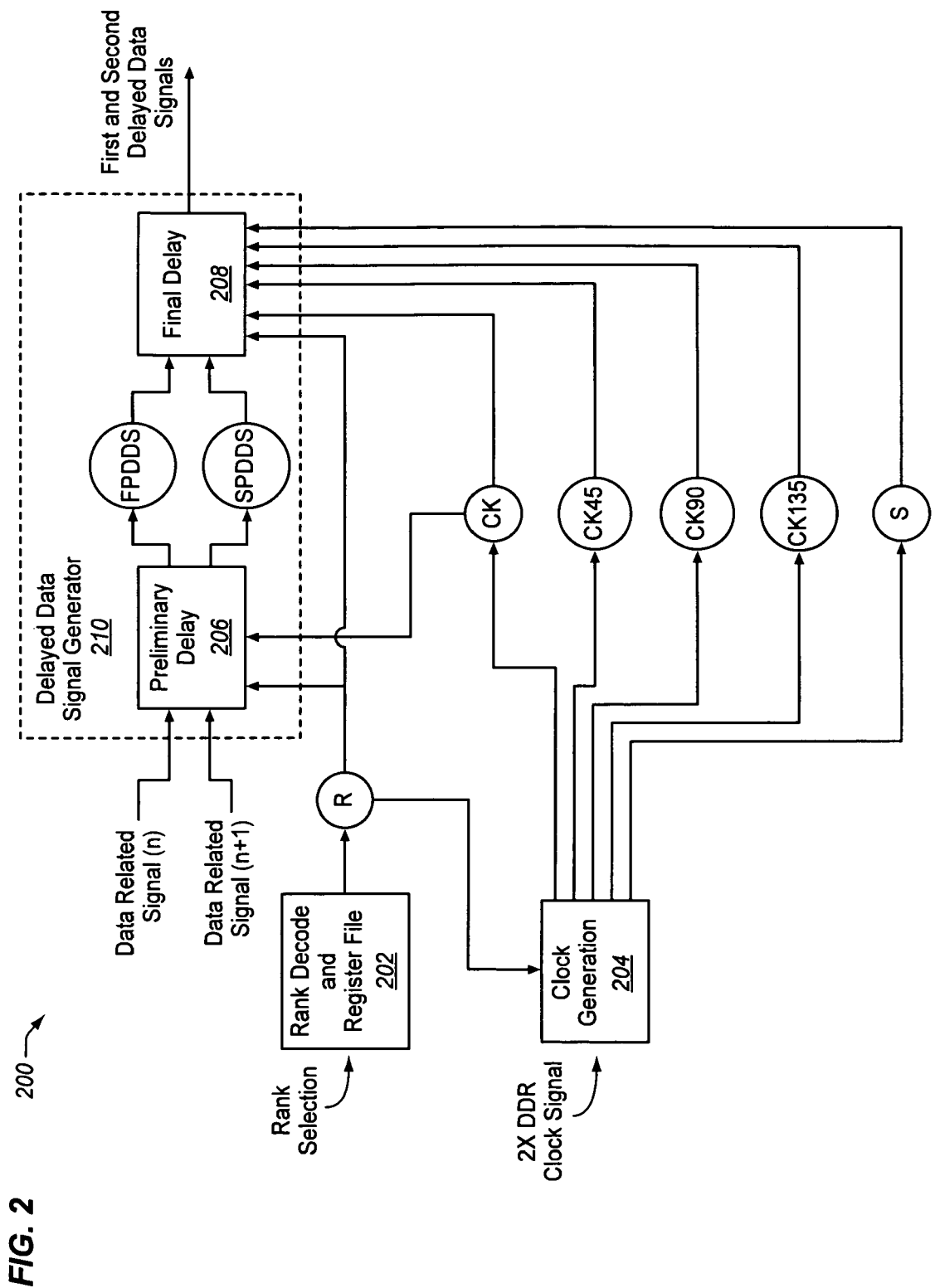
FIG. 2 is a block diagram of an exemplary clock skew control circuit to provide VT invariant skew control between a clock signal and data related signals for application to a memory device in accordance with features and aspects hereof.

FIG. 2 is a block diagram of a clock skew control circuit 200 for providing improved VT invariant DDR3 rank switching in a memory subsystem. A memory controller (similar to controller 102 of FIG. 1 but not shown in FIG. 2) generates signals for application to a DDR3 memory subsystem (similar to DDR3 memories 104 and 106 of FIG. 1 but not shown in FIG. 2). The clock skew control circuit 200 of FIG. 2 utilizes the signals generated by the memory controller and adjusts the skew between a clock signal and data related signals used by the DDR3 memory subsystem to select an appropriate corresponding delay signal to delay the data related signals for application to the DDR3 memory subsystem. (e.g., data signals such as DQ or its corresponding strobe signal DQS).

Rank decode and register file 202 receives a rank selection signal from the memory controller and retrieves the corresponding delay configuration setting from the register file corresponding to the selected rank. For example, where a four rank memory subsystem is utilized, each rank will have a corresponding register in the register file 202 containing predetermined selection signals for the appropriate delay to be applied for the desired rank. The output of rank decode and register file 202 is indicated by label "R". This rank selection output signal ("R") is applied to other components of the clock skew control circuit 200 of FIG. 2 for use in selecting the appropriate delay to adjust skew between clock and data related signals to be applied to the memory subsystem.

Clock generation circuit 204 receives a DDR clock signal having a frequency twice that of the nominal clock signal to be applied to the DDR memory subsystem. Clock generation circuit 204 utilizes divider circuits (e.g., flip-flop devices) and a single fixed delay component to generate various phase shifted versions of the clocks used for the data related signals to be applied to the memory subsystem. In particular, clock generation circuit 204 generates a clock signal of the standard frequency to be applied to the DDR memory subsystem (i.e., a "1× clock" labeled "CK"), a 45° phase shifted delayed version of the clock (labeled "CK 45"), a 90° phase shifted delayed version of the clock (labeled "CK90"), and a 135° phase shifted delayed version of the clock (labeled "CK135"). In addition, clock generation circuit 204 generates a final selection signal (labeled "S") by selecting one of the generated clock signals for application as the final selection signal "S".

A preliminary delay circuit 206 receives the rank selection signal ("R") and the nominal 1× clock signal "CK" from the rank decode and register file 202 and the clock generation circuit 204, respectively. Preliminary delay circuit 206 also receives two data related signals corresponding to the double data rate signals to be applied to the memory subsystem. A first data related signal corresponding to clock pulse "n" at a second data related signal corresponding to clock pulse "n+1" are applied as inputs to preliminary delay circuit 206. Preliminary delay circuit 206 then generates a first preliminary delayed data signal (labeled "FPDDS") and a second preliminary delayed data signal ("SPDDS") for application to a final delay circuit 208.

Final delay circuit 208 receives the rank selection signal ("R") from the rank decode and register file 202 and receives the generated clock signals ("CK", "CK45", "CK90", and "CK135") from the clock generation circuit 204. In addition, final delay circuit 208 receives a final selection signal "S" from clock generation circuit 204 to generate a first and second delayed data signal for application to the DDR memory subsystem.

Figure 3:
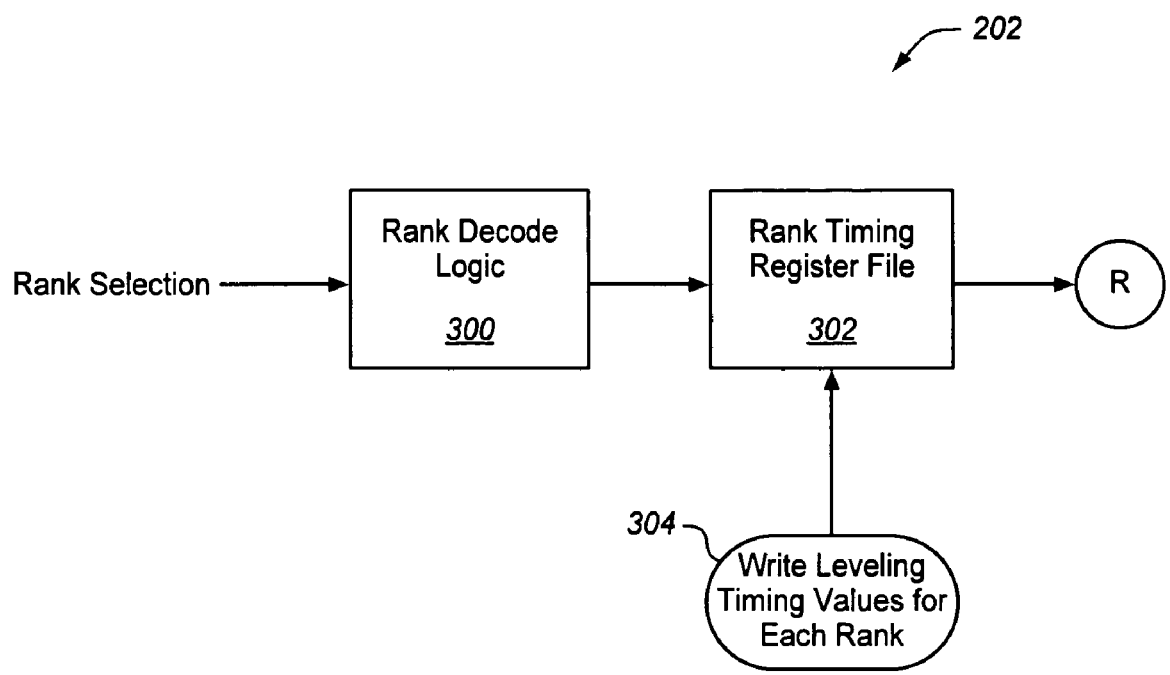
FIG. 3 is a block diagram providing exemplary additional details of a rank decode and register file circuit in the clock skew control circuit of FIG. 2 in accordance with features and aspects hereof.

In combination, preliminary delay circuit 206 and final delay circuit 208 comprise a delayed data signal generation circuit 210 to produce the first and second delayed data signal based on the received data related signals and aligned appropriately for the particular rank based on the generated clock signals. Exemplary detailed embodiments of circuits 202, 204, 206, and 208 are presented in further detail herein below with regard to FIGS. 3 through 6. FIG. 3 is a block diagram providing exemplary additional details of the rank decode and register file circuit 202 of FIG. 2. A rank selection signal generated by the memory controller (not shown) is applied to a rank decode logic circuit 300 and generates an output signal selecting a corresponding register from rank timing register file 302. The preprogrammed value in the selected register from rank timing register file 302 is applied as an output signified as label "R" as discussed above in reference to FIG. 2 and as discussed further below with regard to FIGS. 4, 5, and 6.

A write leveling process as generally known in the art and performed once at system initialization may provide the write leveling timing values (304) for each rank to be stored in a corresponding register for each rank in register file 302. As noted above and as will be discussed further herein below, the values stored in each register are used as multiplexing selection signals for various multiplexers in the remaining circuits of FIG. 2 to provide the desired clock phase alignment corresponding to the selected rank. Thus the desired skew between the CK signals applied to the memory subsystem and the data related signals may be achieved.

Figure 4:
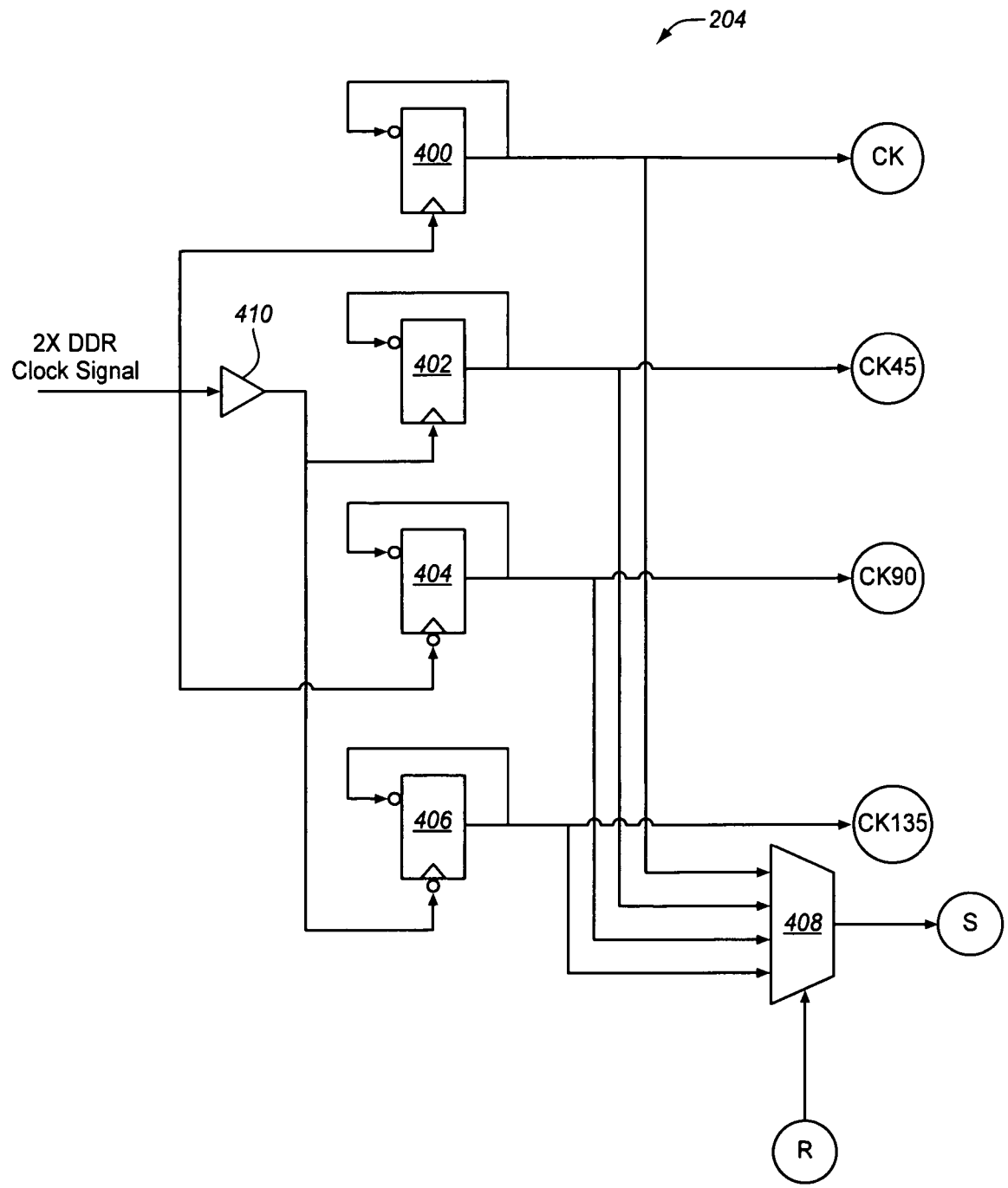
FIG. 4 is a block diagram providing exemplary additional details of a clock generation circuit in the clock skew control circuit of FIG. 2 in accordance with features and aspects hereof.

FIG. 4 is a block diagram depicting exemplary additional details for clock generator circuit 204 of FIG. 2. As noted above, clock generator circuit 204 receives a DDR clock signal (2× DDR Clock Signal) having a frequency twice that of the nominal clock to be applied to the DDR three subsystem (i.e., twice the frequency of a 1× Clock Signal applied to the DDR memory subsystem). The 2× DDR Clock Signal is applied as an enable input to flip-flop 400 and to flip-flop 404 (inverted in the latter case). The 2× DDR clock signal is also applied to fixed delay 410 the output of which is applied as an enable input to flip-flop 402 and 406 (inverted in the latter case). Flip-flop 400 then generates its output when appropriately enabled to provide a divide-by-two version of the received 2× DDR Clock Signal. The generated output of flip-flop 400 is therefore a 1× clock signal (labeled "CK"). The output of flip-flop 404 generates a 90° phase shifted delayed version of the 2× DDR Clock Signal that is also divided by two to generate its output (labeled "CK90").

The fixed delay 410 is selected to approximate a ⅛ clock period of the 1× clock period. Since only a single small delay line as utilized in the clock generator 204 in accordance with features and aspects hereof, the circuit is substantially less variable with respect to PVT parameters of the memory subsystem. Thus the generated clock delayed phases provide substantially less variation in the desired skew between the CK signal and the corresponding data related signal to be applied to the DDR memory subsystem. For example, where the DDR clock frequency is 800 MHz to 1.6 GHz, a 150 ps fixed delay (410) provides approximately ⅛ of a clock period of delay. The PVT variation in this single small delay will be small enough as to not affect the total skew between the 1× clock signal applied to the DDR memory system and the data related signals. A small variation in the fixed delay 410 will be insignificant.

Flip-flop 402, when enabled by the 2× DDR Clock Signal as delayed by fixed delay 410, generates a 45° phase shifted delayed version of the CK signal (labeled "CK45"). In like manner, flip-flop 406, when enabled by the inverted 2× DDR Clock Signal as delayed by fixed delay 410, generates a 135° phase shifted delayed version of the CK signal ("labeled "CK135"). Each of the generated clock signals (CK, CK45, CK90, and CK135) are applied as input to multiplexer 408. Multiplexer 408 also receives a selection control signal ("R") to determine which of the 45° phases of the CK signal should be used as a final selection signal (labeled "S"). The generated clock signals and the final selection signal are applied as inputs to the delayed data signal generation logic 210 noted above in FIG. 2 and discussed further herein below.

Figure 5:
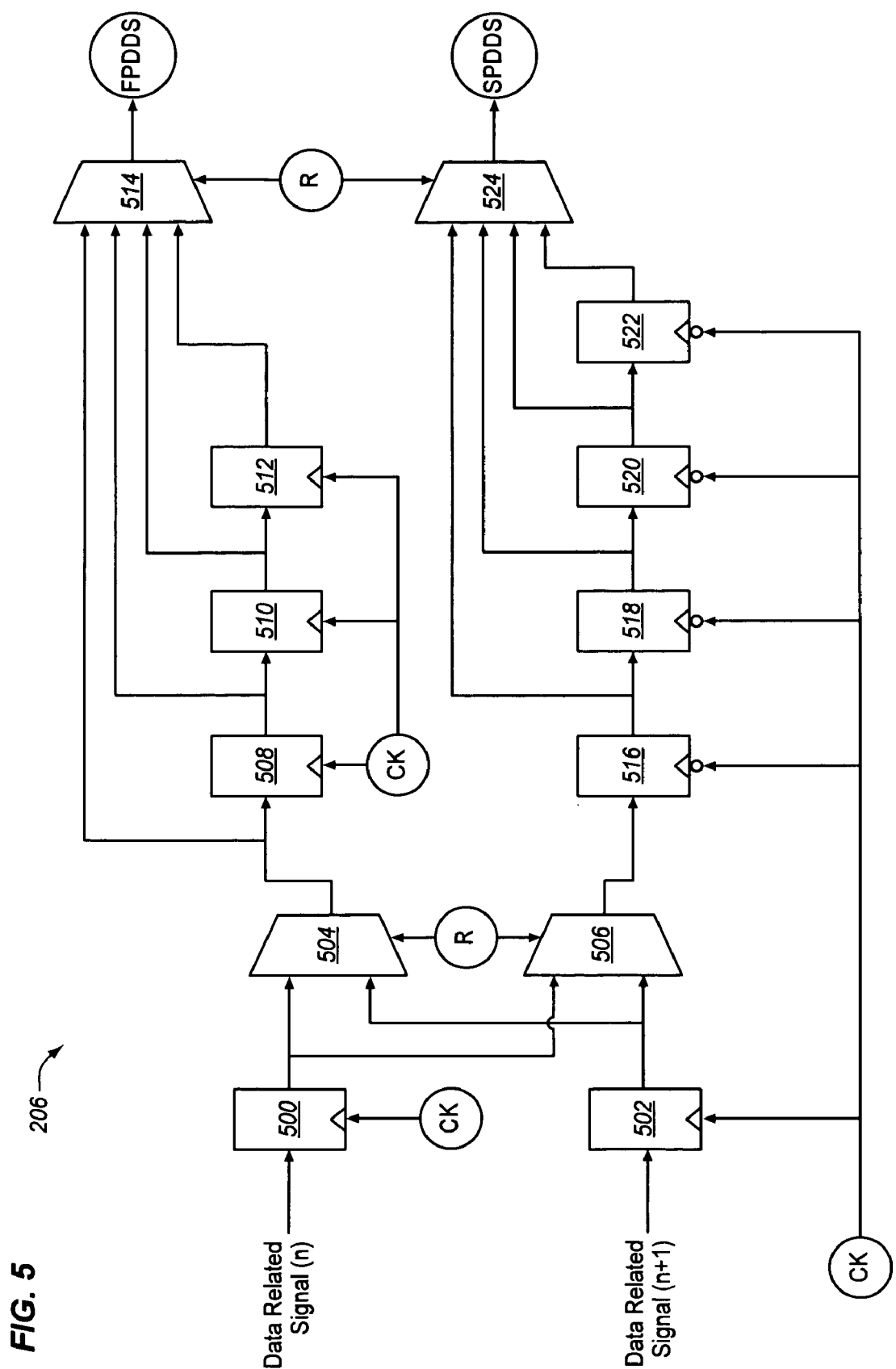
FIG. 5 is a block diagram providing exemplary additional details of a preliminary delay circuit in the clock skew control circuit of FIG. 2 in accordance with features and aspects hereof.

FIG. 5 is a block diagram providing exemplary additional details of the operation of the preliminary delay circuit 206 of FIG. 2. Preliminary delay circuit 206 is generally operable to apply an initial 180° or 360° phase shift to the nominal clock (DQS or DQ) of the DDR subsystem. In addition, further delay may be provided by preliminary delay circuit 206 in accordance with design criteria and specifications of the memory controller and the DDR memory devices coupled with the preliminary delay circuit 206. For example, SDRAM commands and associated data may be transmitted from a controller aligned with a defined edged of the clock signal but the data signals (DQS and DQ) may be delayed based on CAS latency specifications of the SDRAM device. Or, for example, DQ and DQS may have defined delays between their respective signaling to the SDRAM devices.

A first data related signal is received as input to flip-flop 500 enabled/clocked by the CK clock signal. A second data related signal is received as input to flip-flop 502 also clocked by the CK clock signal. The output of flip-flop 500 and the output of flip-flop 502 are both applied as inputs to multiplexer 504 and to multiplexer 506. The rank selection signal "R" is applied as a selection input to multiplexers 504 and 506 to controllably apply one of the input data related signals as an output to a sequence of further delays. Thus, the output of flip-flop 500 and flip-flop 502, as selectively transferred through multiplexers 504 and 506, provide an initial 0° or 180° phase shift or skew for the data related signals relative to the CK signal. The output of multiplexer 504 is then applied as an input to flip-flop 508 which comprises the first in the chain of subsequent flip-flops to provide still further delay in accordance with design specifications and criteria of the memory controller and the DDR memory subsystem. In like manner, the output of multiplexer 506 is applied to an input of flip-flop 516 the output of which then is applied to the first in the chain of subsequent flip-flops to provide still further delay in accordance with design specifications and criteria of the memory controller and the DDR memory subsystem.

The sequence of selectable delays provided by the chain of flip-flops 508, 510, and 512 provides the desired additional delay appropriate for a particular design criteria specification for a particular memory controller and memory subsystem. Each of flip-flops 508, 510, and 512 are clocked or enabled by the CK clock signal. Similarly, flip-flops 516, 518, 520, and 520 provide a selectable sequence of additional delays for a second data related signal where each of these flip-flops is clocked by an inverted version of the CK clock signal and thus provide a 180° phase shift relative to the first data related signal passing through flip-flops 508, 510, and 512.

Multiplexer 514 receives the output of multiplexer 504 as an input and the output of each of flip-flops 508, 510, and 512 as inputs. The rank selection signal ("R") is then applied as a selection control signal to multiplexer 514 to select which of the delayed data signals input to multiplexer 504 is to be applied as the output of multiplexer 514 as a first preliminary delayed data signal "FPDDS". In like manner, multiplexer 524 receives as inputs the output of each of flip-flops 516, 518, 520, and 522. The rank selection signal ("R") is also applied to multiplexer 524 to select which of the delayed data signals input to multiplexer 524 is to be applied as the output of multiplexer 524 (the second preliminary delayed data signal "SPDDS").

Figure 6:
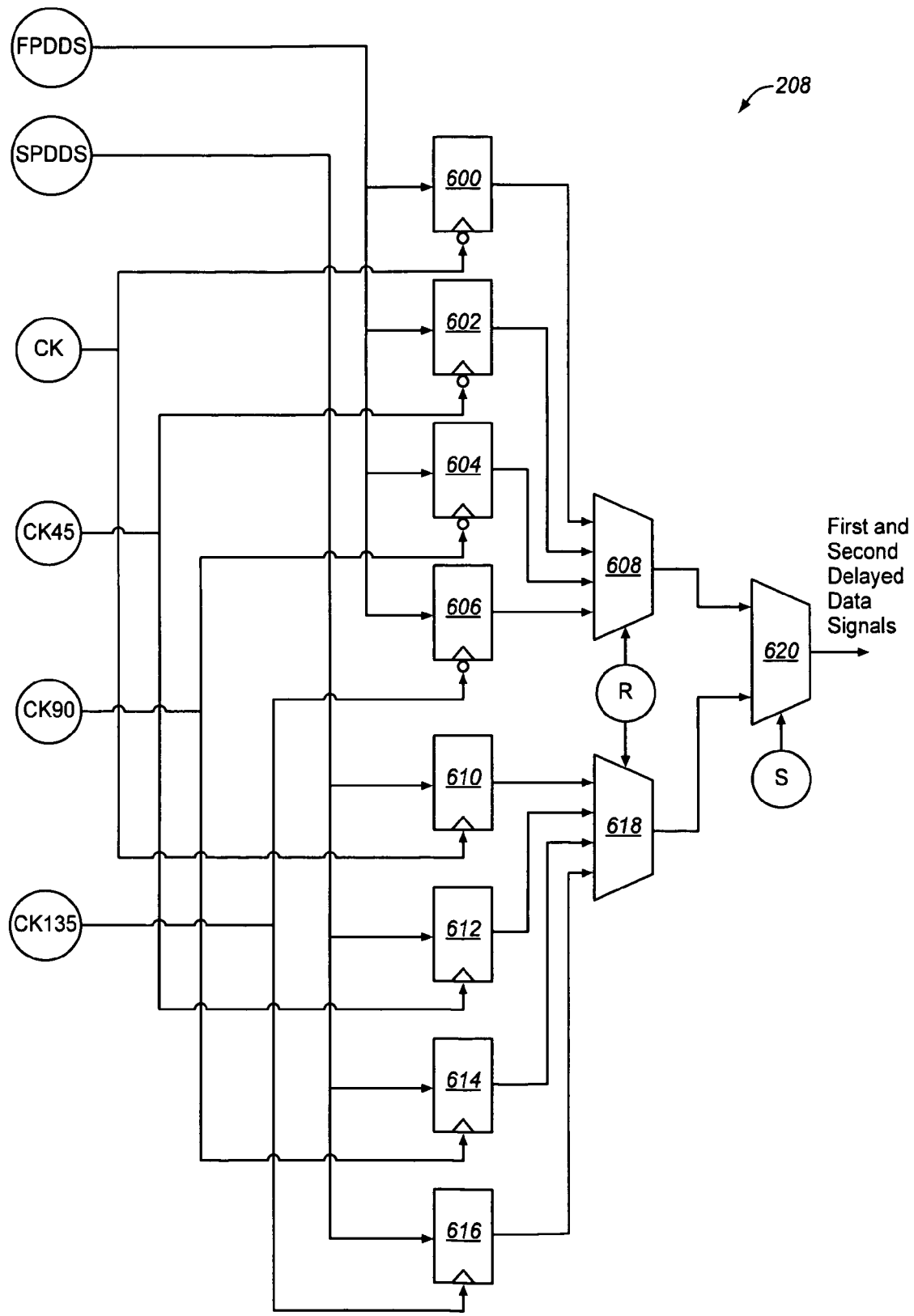
FIG. 6 is a block diagram providing exemplary additional details of a final delay circuit in the clock skew control circuit of FIG. 2 in accordance with features and aspects hereof.

FIG. 6 is a block diagram providing additional exemplary details of the final delay circuit 208 of FIG. 2. Final delay circuit 208 receives the first preliminary delayed data signal ("FPDDS") and the second preliminary delayed data signal ("SPDDS") from the preliminary delay circuit 206 described above with reference to FIG. 5. Final delay circuit 208 also receives the generated clock signals ("CK", "CK45", "CK90", and "CK135") and final selection signal "S" from the clock generation circuit 204 described above with reference to FIG. 4. Final delay circuit 208 also receives the rank selection signal "R" from the rank decode and register file 202 described above with reference to FIG. 3.

Final delay circuit 208 generally comprises a series of flip-flops 600 through 616 each receiving a corresponding phase shifted version of the 1× DDR clock as its enable/clock signal input (e.g., CK, CK45, CK90, or CK135). A first half of the flip-flops (600 through 606) negates the applied phase shifted clock signal to provide a 180° phase shift in addition to the corresponding 0°, 45°, 90°, or 135° phase shifted version of the 1× DDR clock. This first half of the flip-flops (600 through 606) receives the first preliminary delayed data signal ("FPDDS") as their data input signal while the other half of the flip-flops (610 through 616) receive the second preliminary delayed data signal ("SPDDS") as their data input signal.

The output signals of each of the first half of flip-flops (600 through 606) are applied as inputs to multiplexer 608. The output signals of each of the second half of flip-flops (610 through 616) are applied as inputs to multiplexer 618. Both multiplexers 608 and 618 receive the rank selection signal ("R") as a selection control signal to selectively apply one of the four inputs from each multiplexer as its corresponding output signal. The output signals of both multiplexers 608 and multiplexer 618 are applied as inputs to multiplexer 620. The final selection signal "S" is applied as a selection control signal to multiplexer 620 to select one of the two applied inputs for application to the DDR memory system as the first and second delayed data signals.

Thus, the final delay circuit 208 controllably applies an appropriate phase shifted clock signal to adjust the skew for the first delayed data signal and for the second delayed data signal relative to the 1× DDR clock applied to the memory subsystem. The 1× DDR clock and the first and second delayed data signals may then be applied as appropriate to the DDR memory subsystem with an appropriate skew according to the specifications of the memory controller and the memory subsystem. This controlled skew will be less susceptible to PVT variations due to the design of the delayed signal generation in accordance with features and aspects herein. The skew is determined by the rank selection signal and the corresponding clock signals generated by the clock generation circuits as described above with respect to FIGS. 2 through 4. Since the clock generation circuit 204 utilizes only a single small fixed delay line (approximating ⅛ clock period of the 1× DDR clock signal) any PVT related variations in the generated clock signals will be negligible and hence will obviate problems of past designs that require periodic repetition of the right leveling process. Rather, a single write leveling operation may be performed at system initialization to determine and program the rank selection delay signals to be stored in the rank decode and register file 202 as discussed above with reference to FIGS. 2 and 3.

Figure 7:
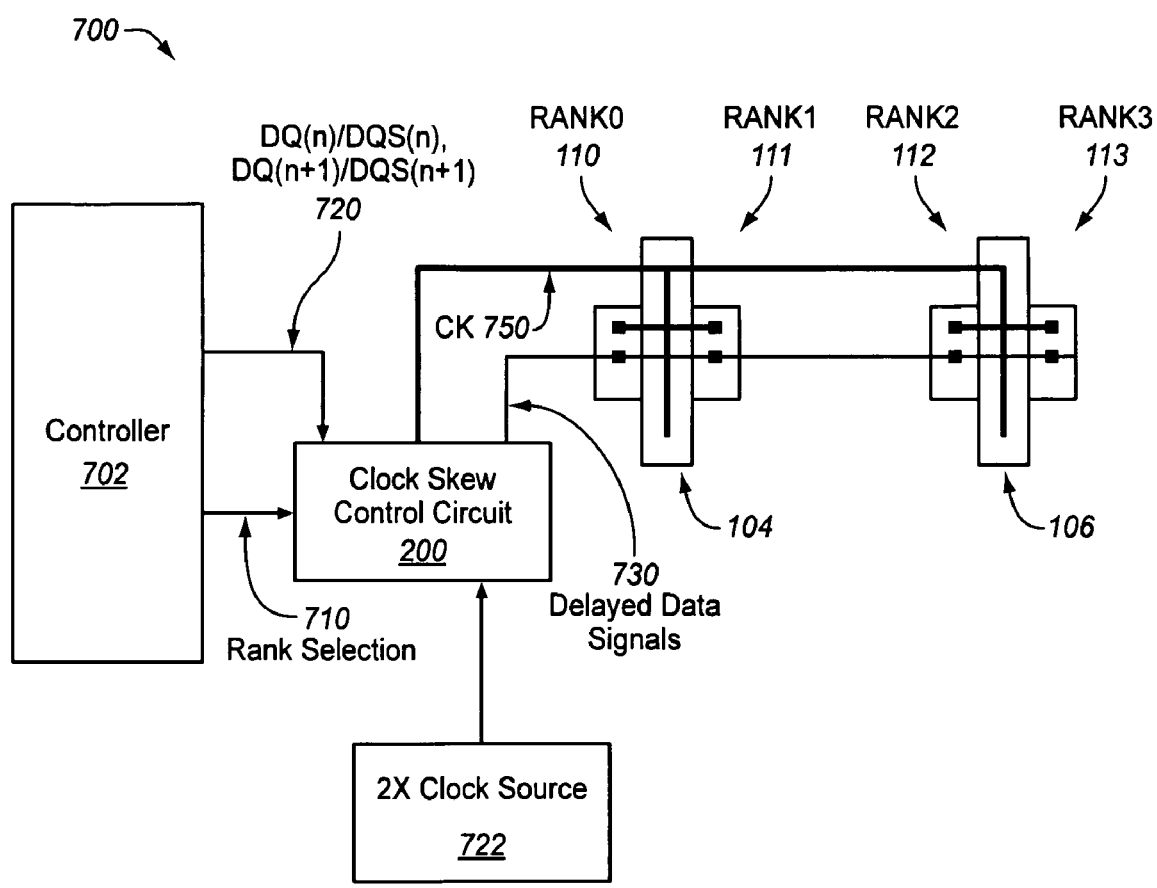
FIG. 7 is a block diagram of a system including a clock skew control circuit in accordance with features and aspects hereof.

FIG. 7 is a block diagram of a system 700 incorporating clock skew control circuit 200 as discussed above. As in FIG. 1, DDR3 SDRAM elements 104 and 106 include four ranks (RANK0 110, RANK1 111, RANK2 112, and RANK3 113). For simplicity of FIG. 7 in this discussion, only a single memory device is shown in each rank. Those of ordinary skill in the art will readily recognize similar application of the clock skew control circuit 200 generated signals for application of data related signals to the memory devices in each of the four ranks.

A memory controller 702 generates a first and second data related signal 720 for application to the clock skew control circuit 200. As noted above, the data related signals may be a data signal and/or a data strobe signal (i.e., DQ and/or DQS). In addition, controller 702 generates a rank selection signal 710 for application to the clock skew control circuit 200. A 2× clock source 722 generates a 2× clock signal having a frequency twice that of the nominal DDR clock frequency. The 2× clock signal is applied as another input to clock skew control circuit 200.

As discussed above with reference to FIGS. 2 through 6, clock skew control circuit 200 generates a 1× DDR clock signal 750 for application to the various memory devices of the plurality of ranks (110 through 113) of the memory elements 104 and 106. In addition, clock skew control circuit 200 generates the delayed data signals 730 for application to the various memory devices of the multiple ranks of the memory subsystem. As discussed above, the delayed data signals are delayed in accordance with the rank selection signal 710 and the preprogrammed range parameter information stored within the clock skew control circuit 200 following initialization right leveling operation. The clock skew control circuit 200 generates internally phase shifted versions of the 1× clock signal to align the DQ/DQS data related signals with an appropriate skewed delay of the 1× clock signal 750. The phase shifted versions are generated as discussed above using clock divider circuits applied to the 2× clock signal and a single fixed delay line approximating ⅛ of the period of the 1× clock signal. Thus the skewed delay is far less susceptible to VT variations in the operation of the system 700 as compared to prior techniques. Any remaining VT variations will stay well within the ¼ cycle tolerances of most standardized DDR3 SDRAM devices.

While the invention has been illustrated and described in the drawings and foregoing description, such illustration and description is to be considered as exemplary and not restrictive in character. One embodiment of the invention and minor variants thereof have been shown and described. In particular, features shown and described as exemplary software or firmware embodiments may be equivalently implemented as customized logic circuits and vice versa. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A clock skew control circuit for controlling timing skew between a clock signal (CK) and a first data related signal and between the CK signal and a second data related signal in a double data rate (DDR3) synchronous dynamic random access memory (SDRAM) memory subsystem, the clock skew control circuit comprising:

a clock generator coupled to receive a 2× clock signal having a frequency twice that of the CK signal of the DDR3 SDRAM and adapted to generate the CK signal and adapted to generate a 45 degree phase shifted version of the CK signal (CK45) and a 90 degree phase shifted version of the CK signal (CK90) and a 135 degree phase shifted version of the CK signal (CK135); and a delayed data signal generator coupled to receive the first and second data related signals and coupled to receive the CK signal and the CK45 signal and the CK90 signal and the CK135 signal, wherein the delayed data signal generator is adapted to generate a first delayed data signal from the first data related signal selectively aligned with a leading edge of one of the CK signal and the CK45 signal and the CK90 signal and the CK135 signal, and wherein the delayed data signal generator is adapted to generate a second delayed data signal from the second data related signal selectively aligned with a trailing edge of one of the CK signal and the CK45 signal and the CK90 signal and the CK135 signal, wherein the first and second delayed data signals are applied to a DDR3 SDRAM device.

2. The control circuit of claim 1 wherein the clock generator further comprises:

a single fixed delay line providing a delay of approximately ⅛ of the period of the CK signal.

3. The control circuit of claim 1 wherein the first and second data related signals are a first and second data strobe signals (DQS), respectively.

4. The control circuit of claim 1 wherein the first and second data related signals are a first and second data signals (DQ), respectively.

5. The control circuit of claim 1 further comprising:

a rank delay decoder coupled to receive a rank number from a memory controller and coupled to the delayed data signal generator to control selection of CK, CK45, CK90, and CK135 signals for alignment of the first and second delayed data signals.

6. The control circuit of claim 5 wherein the rank delay decoder further comprises a register file wherein each register of the register file stores delay information associated with a corresponding rank number, wherein the rank delay decoder is adapted to generate a delay selection signal for application to the delayed data signal generator to control selection of the CK, CK45, CK90, and CK135 signals for alignment of the first and second delayed data signals.

7. The control circuit of claim 1 wherein the delayed data signal generator further comprises:

a preliminary delay generator coupled to receive the first data related signal and the second data related signal and coupled with the clock generator to receive the CK signal, the preliminary delay generator adapted to generate a first preliminary delayed data signal and a second preliminary delayed data signal from the first and second data related signals wherein the first preliminary delayed data signal is delayed by a 180 degree phase shift of the CK signal (CK180) and wherein the second preliminary delayed data signal is delayed by a 360 degree phase shift of the CK signal (CK360); and a final delay generator coupled with the preliminary delay generator to receive the first and second preliminary delayed data signals and coupled with the clock generator to receive the CK180 signal and the CK360 signal and the CK45 signal and the CK90 signal and the CK135 signal, the final delay generator adapted to generate the first delayed data signal from the first preliminary delayed data signal aligned with an edge of the CK180 clock signal or selectively aligned with the leading edge of one of the CK45, CK90, and CK135 signals, the final delay generator further adapted to generate the second delayed data signal from the second preliminary delayed data signal aligned with an edge of the CK360 clock signal or selectively aligned with the trailing edge of one of the CK45, CK90, and CK135 signals.

8. A memory subsystem comprising:

a memory controller circuit, the memory controller circuit adapted to generate a first data related signal and a second data related signal and adapted to generate a rank selection signal;

a double data rate 3 (DDR3) synchronous dynamic random access memory (SDRAM) circuit having multiple ranks, the DDR3 SDRAM circuit adapted to receive a 1× DDR clock signal and adapted to receive data related signals, the DDR3 SDRAM circuit having a specified timing skew relationship between the 1× DDR clock signal and the data related signals;

a 2× clock signal source that generates a 2× clock signal having a frequency twice the frequency of a 1× DDR clock signal (CK signal) expected by the DDR3 SDRAM circuit; and a clock skew control circuit coupled to receive the first data related signal and the second data related signal and the rank selection signal from the memory controller circuit and coupled to receive the 2× clock signal from the 2× clock signal source, the clock skew control circuit adapted to generate a first delayed data signal and a second delayed data signal and coupled to apply the first and second delayed data signals to the DDR3 SDRAM circuit, the clock skew control circuit further comprising:

a clock generator coupled to receive a 2× clock signal and adapted to generate CK signal and adapted to generate a 45 degree phase shifted version of the CK signal (CK45) and a 90 degree phase shifted version of the CK signal (CK90) and a 135 degree phase shifted version of the CK signal (CK135); and a delayed data signal generator coupled to receive the first and second data related signals and coupled to receive the CK signal and the CK45 signal and the CK90 signal and the CK135 signal, wherein the delayed data signal generator is adapted to generate the first delayed data signal from the first data related signal selectively aligned with a leading edge of one of the CK signal and the CK45 signal and the CK90 signal and the CK135 signal, and wherein the delayed data signal generator is adapted to generate the second delayed data signal from the second data related signal selectively aligned with a trailing edge of one of the CK signal and the CK45 signal and the CK90 signal and the CK135 signal, wherein the first and second delayed data signals are applied to a DDR3 SDRAM device.

9. The memory subsystem of claim 8 wherein the clock generator further comprises:

a single fixed delay line providing a delay of approximately ⅛ of the period of the CK signal.

10. The memory subsystem of claim 8 wherein the first and second data related signals are a first and second data strobe signals (DQS), respectively.

11. The memory subsystem of claim 8
wherein the first and second data related signals are a first and second data signals (DQ), respectively.

12. The memory subsystem of claim 8 wherein the clock skew control circuit further comprises:
a rank delay decoder coupled to receive a rank number from a memory controller and coupled to the delayed data signal generator to control selection of CK, CK45, CK90, and CK135 signals for alignment of the first and second delayed data signals.

13. The memory subsystem of claim 12
wherein the rank delay decoder further comprises a register file wherein each register of the register file stores delay information associated with a corresponding rank number,
wherein the rank delay decoder is adapted to generate a delay selection signal for application to the delayed data signal generator to control selection of the CK, CK45, CK90, and CK135 signals for alignment of the first and second delayed data signals.

14. The memory subsystem of claim 8
wherein the delayed data signal generator further comprises:
a preliminary delay generator coupled to receive the first data related signal and the second data related signal and coupled with the clock generator to receive the CK signal, the preliminary delay generator adapted to generate a first preliminary delayed data signal and a second preliminary delayed data signal from the first and second data related signals wherein the first preliminary delayed data signal is delayed by a 180 degree phase shift of the CK signal (CK180) and wherein the second preliminary delayed data signal is delayed by a 360 degree phase shift of the CK signal (CK360); and
a final delay generator coupled with the preliminary delay generator to receive the first and second preliminary delayed data signals and coupled with the clock generator to receive the CK180 signal and the CK360 signal and the CK45 signal and the CK90 signal and the CK135 signal, the final delay generator adapted to generate the first delayed data signal from the first preliminary delayed data signal aligned with an edge of the CK180 clock signal or selectively aligned with the leading edge of one of the CK45, CK90, and CK135 signals, the final delay generator further adapted to generate the second delayed data signal from the second preliminary delayed data signal aligned with an edge of the CK360 clock signal or selectively aligned with the trailing edge of one of the CK45, CK90, and CK135 signals.

* * * * *